United States Patent
Yang et al.

(10) Patent No.: US 8,510,635 B2
(45) Date of Patent: Aug. 13, 2013

(54) METHOD FOR EVALUATING FAILURE RATE

(75) Inventors: Yun-Chi Yang, Hsinchu County (TW);
Yen-Song Liu, Hsinchu (TW);
Chin-Hsien Chen, Pingtung County (TW); Sheng-Yu Wu, Miaoli County (TW); Kuan-Cheng Su, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 364 days.

(21) Appl. No.: 12/979,914

(22) Filed: Dec. 28, 2010

(65) Prior Publication Data
US 2012/0166130 A1   Jun. 28, 2012

(51) Int. Cl.
*G11C 29/00* (2006.01)

(52) U.S. Cl.
USPC ............................ 714/767; 702/117; 702/118

(58) Field of Classification Search
USPC .................................. 714/767; 702/117–118
See application file for complete search history.

(56) References Cited

U.S. PATENT DOCUMENTS

| | | | |
|---|---|---|---|
| 4,939,694 A | 7/1990 | Eaton et al. | |
| 6,462,574 B1 * | 10/2002 | Izuru et al. | ............... 324/750.05 |
| 6,894,526 B2 | 5/2005 | Marr | |
| 7,073,099 B1 | 7/2006 | Sutardja et al. | |
| 7,215,134 B2 | 5/2007 | Marr | |
| 2005/0185492 A1 | 8/2005 | Harrand | |
| 2007/0168781 A1 | 7/2007 | Sutardja et al. | |

* cited by examiner

*Primary Examiner* — Guy Lamarre
(74) *Attorney, Agent, or Firm* — Ding Yu Tan

(57) ABSTRACT

A method for evaluating failure rate, which is applied to a plurality of semiconductor chips with error checking and correcting function includes the following steps. A first read-write test operation is applied to the semiconductor chips, thereby obtaining a plurality of first failure bit counting values. The error checking and correcting function of each of the semiconductor chips is off. An aging test is applied to the semiconductor chips. A second read-write test operation as the first read-write test operation is applied to the semiconductor chips, thereby obtaining a plurality of second failure bit counting values. The number of the semiconductor chips, the first failure bit counting values, the second failure bit counting values and an error checking and correcting coefficient are calculated to obtain a failure rate of the semiconductor chips.

4 Claims, 1 Drawing Sheet

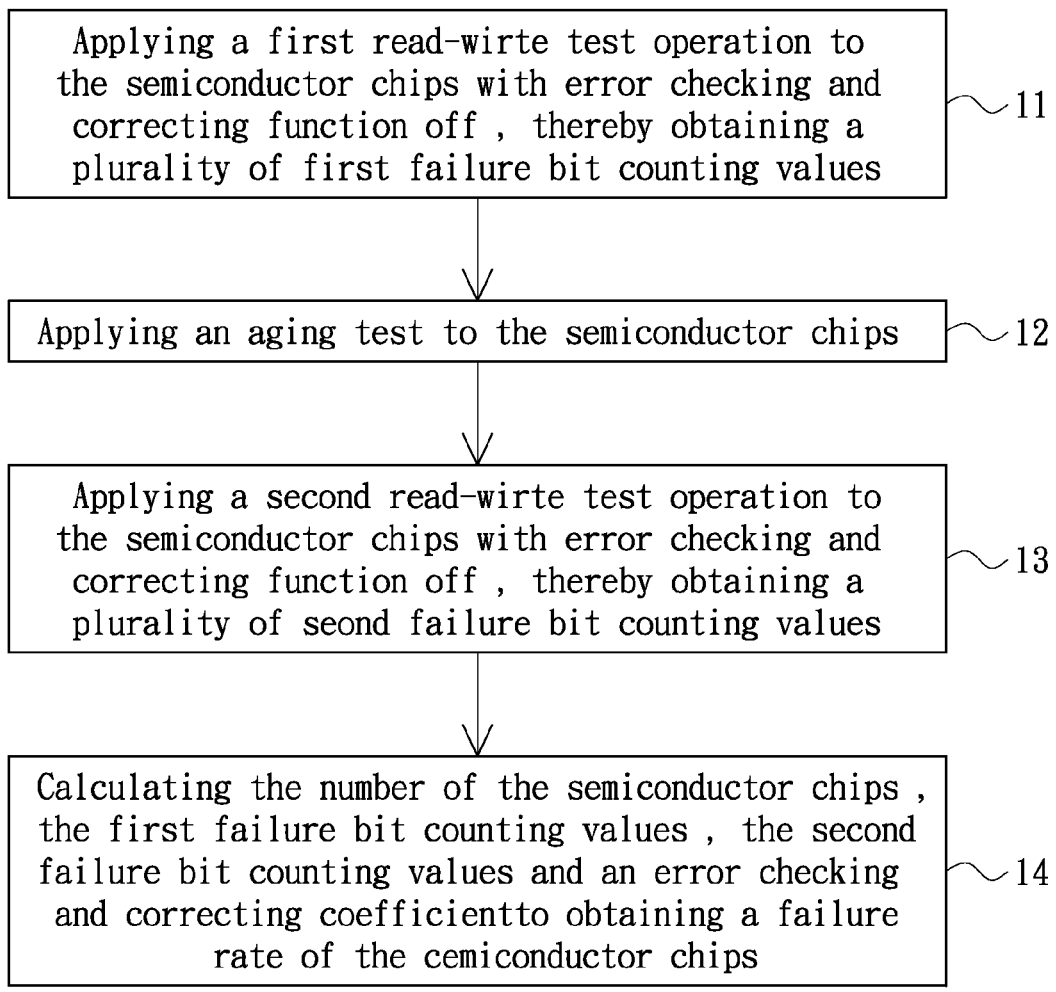

METHOD FOR EVALUATING FAILURE RATE

FIELD OF THE INVENTION

The present invention relates to a testing method of semiconductor chips, and particularly to a method for evaluating failure rate, which is applied to a plurality of semiconductor chips with error checking and correcting (ECC) function.

BACKGROUND OF THE INVENTION

Reliability is an important evaluating indicator of the quality of a semiconductor chip, especially, a memory chip with high density. In general, a failure rate of a lot of memory chips must be less than a predetermined vale required by a custom, for example, 32 defects parts per million (DPPM). The failure rate of the memory chips is less, and the reliability of the memory chips is better. However, in a conventional method for evaluating failure rate, each of the memory chips is used as an evaluating unit. Thus, a huge amount of the memory chips are used as samples to be tested. For example, if the failure rate of the memory chips is required to be equal to 32 DPPM, more than 4000 memory chips are generally provided to be tested so as to evaluate the exact failure rate of the memory chips. Thus, the conventional method for evaluating the failure rate includes a time-consuming and laborious testing process, which has a high evaluating cost.

Therefore, what is needed is to a method for evaluating failure rate to overcome the above disadvantages.

SUMMARY OF THE INVENTION

The present invention provides a method for evaluating failure rate, which is applied to a plurality of semiconductor chips with error checking and correcting function, thereby reducing evaluating cost.

The present invention provides a method for evaluating failure rate, which is applied to a plurality of semiconductor chips with error checking and correcting function. In the method for evaluating failure rate, a first read-write test operation is applied to the semiconductor chips with error checking and correcting function, thereby obtaining a plurality of first failure bit counting values corresponding to the semiconductor chips. The error checking and correcting function of each of the semiconductor chips is turned off. Thereafter, an aging test is applied to the semiconductor chips. Afterwards, a second read-write test operation as the first read-write test operation is applied to the semiconductor chips, thereby obtaining a plurality of second failure bit counting values corresponding to the semiconductor chips. Then, the number of the semiconductor chips, the first failure bit counting values, the second failure bit counting values and an error checking and correcting coefficient are calculated to obtain a failure rate of the semiconductor chips.

In one embodiment of the present invention, each of the semiconductor chips comprises a random access memory unit.

In one embodiment of the present invention, the aging test comprises a burn-in test for 48 hours.

In one embodiment of the present invention, the method further includes a step of judging a reliability of the semiconductor chips according to the failure rate.

In one embodiment of the present invention, the failure rate is calculated by $$\sum_{1}^{M} P_{FB}(n) \times P_{FD}(n),$$

M represents the number of the semiconductor chips, $P_{FB}(n)$ is equal to $1/M$, and $P_{FD}(n)$ is a failure probability of one of the semiconductor chips.

In one embodiment of the present invention, $$P_{FD}(n) = 1 - \prod_{i=1}^{n} \frac{N_w - n_b - i + 1}{N_w},$$

Nw represents the error checking and correcting coefficient, $n_b$ represents an average value of the first failure bit counting values of the semiconductor chips, and n represents FBC of each of the semiconductor chips.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 illustrates a process flow of a method of evaluating failure rate in accordance with an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIG. 1 illustrates a process flow of a method of evaluating failure rate in accordance with an embodiment of the present invention. The method can be applied to a plurality of semiconductor chips with error checking and correcting function. For example, each of the semiconductor chips includes a random access memory (RAM) unit. The method of evaluating failure rate includes the following steps. Referring to FIG. 1, in a step 11, a first read-write test operation is applied to the semiconductor chips with error checking and correcting function, thereby obtaining a plurality of first failure bit counting (FBC) values corresponding to the semiconductor chips. During the first read-write test operation, the error checking and correcting function of each of the semiconductor chips is turned off. For example, the first read-write test operation is applied to a semiconductor chip including a 16 megabits random access memory unit, whose error checking and correcting function is turned off. Each bit of the 16 megabits random access memory unit is used as an evaluating unit so that the number of the failure bits is counted. In other words, a known information is written into the semiconductor chip and then is read from the semiconductor chip so that the read information is compared with the written information. If one bit of the read information is not in conformity with the corresponding bit of the written information, the bit is recorded as a failure bit. All the failure bits of the semiconductor chip are counted, thereby obtaining the first failure bit counting value of the semiconductor chip.

Next, still referring to FIG. 1, in a step 12, an aging test is applied to the semiconductor chips after the first read-write test operation. In the present embodiment, the aging test includes a burn-in test for 48 hours. Thus, the semiconductor chips are placed in a severe environment for a specific period in the step 12.

Next, still referring to FIG. 1, in a step 13, after the aging test, a second read-write test operation as the first read-write test operation is applied to the semiconductor chips with error checking and correcting function, thereby obtaining a plurality of second failure bit counting values corresponding to the semiconductor chips. During the second read-write test operation, the error checking and correcting function of each of the semiconductor chips is still turned off. Because the number of the failure bits of the semiconductor chips may be increase after the aging test, the second read-write test operation can obtain the number of the increased failure bits. The second read-write test operation is similar to the first read-write test operation, and is not described repeatedly here.

Thereafter, in a step 14, the number of the semiconductor chips, the first failure bit counting values, the second failure bit counting values and an error checking and correcting coefficient can be calculated to obtain a failure rate of the semiconductor chips, thereby evaluating a reliability of the semiconductor chips. The failure rate of the semiconductor chips is an accumulated failure rate. The error checking and correcting coefficient is represented by Nw and is configured for representing the error checking and correcting ability. The error checking and correcting coefficient can be the number of the words of each of the semiconductor chips. For example, in the semiconductor chip including the 16 megabits random access memory unit, 32 bits constitutes a word. Each word includes an error checking and correcting bit. Thus, the error checking and correcting coefficient can be calculated by formula (1): Nw=16 megabits/32 bit.

Table 1 shows the calculation of the accumulated failure rate of the semiconductor chips.

TABLE 1

| Chip | 1st FBC value $a_n$ | 2nd FBC value $b_n$ | FBC $b_n - a_n$ | probability of the failure bits $c_n$ | contribution degree of the failure bits d | failure rate $F_n$ | accumulated failure rate Fr |
|---|---|---|---|---|---|---|---|
| $C_1$ | 0 | 0 | 0 | 0 | 1.89% | 0 | 0 |
| $C_2$ | 1 | 2 | 1 | $3.815 \times 10^{-6}$ | 1.89% | 0.07 | 0.07 |
| $C_3$ | 19 | 20 | 1 | $7.248 \times 10^{-5}$ | 1.89% | 1.37 | 1.44 |
| $C_n$ | ... | ... | ... | ... | 1.89% | ... | $\sum_1^M F_n$ |

In the present embodiment, 53 semiconductor chips are used as samples to be tested. The number of the semiconductor chips is represented by M. That is, M=53. Table 1 mostly shows three semiconductor chips of the 53 semiconductor chips, which including a semiconductor chip $C_1$, a semiconductor chip $C_2$ and a semiconductor chip $C_3$. The first failure bit counting value $a_1$ of the semiconductor chip $C_1$ is equal to 0, and the second failure bit counting value $b_1$ of the semiconductor chip $C_1$ is equal to 0. A difference $b_1-a_1$ of the first failure bit counting value $a_1$ and the second failure bit counting value $b_1$ of the semiconductor chip $C_1$ is represented by FBC. The first failure bit counting value $a_2$ of the semiconductor chip $C_2$ is equal to 1, and the second failure bit counting value $b_2$ of the semiconductor chip $C_2$ is equal to 1. Thus, a difference $b_2-a_2$ of the first failure bit counting value $a_2$ and the second failure bit counting value $b_2$ of the semiconductor chip $C_2$ is equal to 1 (i.e., FBC=1). The first failure bit counting value $a_3$ of the semiconductor chip $C_3$ is equal to 19, and the second failure bit counting value $b_3$ of the semiconductor chip $C_3$ is equal to 20. Thus, a difference $b_3-a_3$ of the first failure bit counting value $a_3$ and the second failure bit counting value $b_3$ of the semiconductor chip $C_3$ is equal to 1 (i.e., FBC=1). Similarly, a difference $b_n-a_n$ (n=1, 2, ... M) of the first failure bit counting value $a_n$ (n=1, 2, ... M) and the second failure bit counting value $b_n$ (n=1, 2, ... M) of the semiconductor chip $C_n$ (n=1, 2, ... M) can be obtained.

In addition, a bit failure probability of each of the semiconductor chips is represented by $c_n$ (n=1, 2, ... M). The bit failure probability of each of the semiconductor chips can be inversed from a repaired failure probability each of the semiconductor chips. For example, $c_n$ is equal to $P_{FD}(n)$ (n=1, 2, ... M), which can be obtained by calculating the number of the semiconductor chips, the first failure bit counting values, the second failure bit counting values and the error checking and correcting coefficient with formula (2):

$$P_{FD}(n) = 1 - \prod_{i=1}^{n} \frac{N_w - n_b - i + 1}{N_w} (n = 1, 2, \ldots M).$$

Nw represents the error checking and correcting coefficient, $n_b$ represents an average value of the first failure bit counting values of the semiconductor chips, and n is equal to the FBC of each of the semiconductor chips. Thus, the bit failure probability of each of the semiconductor chips can be calculated out. In the present embodiment, the number of the semiconductor chips M is 53, a contribution degree of the failure bits of each of the semiconductor chips after the burn-in test is represented by d or $P_{FB}(n)$, and $P_{FB}(n)=1/M$. In the present embodiment, d=1/53=1.89%. Thus, the failure rate of each of the semiconductor chips is represented by $F_n$ and can be calculated by formula (3): $F_n = c_n \times d \times 10^6$ (n=1, 2, ... M). The accumulated failure rate of the semiconductor chips is represented by Fr and is equal to a sum of the failure rates of the semiconductor chips, i.e., $$Fr = \sum_1^M Fn = \sum_1^M P_{FB}(n) \times P_{FD}(n).$$

Next, a step of judging a reliability of the semiconductor chips according to the accumulated failure rate can be performed. For example, if the accumulated failure rate of the semiconductor chips is not more than a predetermined vale required by a custom, the reliability of the semiconductor chips is accepted by the custom.

In summary, the failure rate of the semiconductor chips is evaluated by the failure bits of each of the semiconductor chips. Because each of the semiconductor chips includes at least millions of bits, only tens of or hundreds of the semiconductor chips are needed in the method of evaluating failure rate of the present invention to obtain the failure rate with good reference value. The cost of evaluating failure rate is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for evaluating failure rate, which is applied to a plurality of semiconductor chips with error checking and correcting function, a number of the semiconductor chips being represented by M, the method comprising:

applying a first read-write test operation to the semiconductor chips so that each of the semiconductor chips has a first read information and a first written information corresponding to the first read information, wherein the error checking and correcting function of each of the semiconductor chips is off, one bit of the first read information that is not in conformity with the corresponding bit of the first written information is recorded as a first failure bit, a first failure bit counting value of each of the semiconductor chips is obtained by counting the first failure bit, thereby obtaining a plurality of first failure bit counting values corresponding to the semiconductor chips;

after performing the first read-write test operation, applying an aging test to the semiconductor chips;

applying a second read-write test operation to the semiconductor chips after the aging test so that each of the semiconductor chips has a second first read information and a second written information corresponding to the second read information, wherein the error checking and correcting function of each of the semiconductor chips is still off, one bit of the second read information that is not in conformity with the corresponding bit of the second written information is recorded as a second failure bit, a second failure bit counting value of each of the semiconductor chips is obtained by counting the second failure bit, thereby obtaining a plurality of second failure bit counting values corresponding to the semiconductor chips; and calculating a failure rate of the semiconductor chips, the failure rate being an accumulated failure rate calculated by $$\sum_{1}^{M} P_{FB}(n) \times P_{FD}(n),$$

wherein the $P_{FB}(n)$ is equal to $1/M$, and the $P_{FD}(n)$ is a bit failure probability of each of the semiconductor chips calculated by $$P_{FD}(n) = 1 - \prod_{i=1}^{n} \frac{N_w - n_b - i + 1}{N_w},$$

wherein the $N_w$ represents an error checking and correcting coefficient, the $n_b$ represents an average value of the first failure bit counting values of the semiconductor chips, and the n represents a difference of the first failure bit counting value and the second failure bit counting value of each of the semiconductor chips.

2. The method as claimed in claim 1, wherein each of the semiconductor chips comprises a random access memory unit.

3. The method as claimed in claim 1, wherein the aging test comprises a burn-in test for 48 hours.

4. The method as claimed in claim 1, further comprising judging a reliability of the semiconductor chips according to the failure rate.

* * * * *